United States Patent [19]

Iwata

[11] Patent Number: 5,095,361

[45] Date of Patent: Mar. 10, 1992

[54] TAPE-LIKE CARRIER FOR MOUNTING OF INTEGRATED CIRCUIT

[75] Inventor: Yuji Iwata, Tokyo, Japan

[73] Assignee: NEC Corporation, Tokyo, Japan

[21] Appl. No.: 457,580

[22] Filed: Dec. 27, 1989

[30] Foreign Application Priority Data

Dec. 27, 1988 [JP] Japan .................... 1-333762

[51] Int. Cl.⁵ ............................. H01L 23/48
[52] U.S. Cl. ......................... 357/80; 357/70; 437/217
[58] Field of Search ................ 357/70, 80, 84

[56] References Cited

U.S. PATENT DOCUMENTS

| 4,234,666 | 11/1980 | Gursky | 357/70 |
|---|---|---|---|
| 4,259,436 | 3/1981 | Tabuchi et al. | 437/217 |
| 4,308,339 | 12/1981 | Lindberg | 437/217 |
| 4,396,457 | 8/1983 | Bakermans | 357/70 |
| 4,459,607 | 7/1984 | Reid | 357/70 |
| 4,689,875 | 9/1987 | Solstad | 357/70 |
| 4,721,992 | 1/1988 | Emamjomeh et al. | 357/70 |
| 4,736,236 | 4/1988 | Butt | 357/70 |
| 4,736,520 | 4/1988 | Morris | 357/70 |
| 4,772,936 | 9/1988 | Reding et al. | 357/70 |
| 4,801,999 | 1/1989 | Hayward et al. | 357/70 |
| 4,947,235 | 8/1990 | Roth et al. | 357/84 |

FOREIGN PATENT DOCUMENTS

| 54-111762 | 9/1979 | Japan | 357/70 |
|---|---|---|---|
| 54-113249 | 9/1979 | Japan | 357/70 |
| 2178231 | 2/1987 | United Kingdom | 437/206 |

Primary Examiner—Andrew J. James
Assistant Examiner—Viet Q. Nguyen
Attorney, Agent, or Firm—Helfgott & Karas

[57] ABSTRACT

A tape-like carrier for mounting of an integrated circuit including leads secured to a flexible insulating film has metallic radiation films provided on the flexible insulating film around each aperture formed in the film for a semiconductor pellet. The leads project from the respective metallic radiation film inwardly of the respective aperture. Heat of the leads during an inner lead bonding is immediately conducted to the metallic radiation film and released from the surface thereof so that heat of the leads can be more efficiently removed from the leads during the inner lead bonding.

9 Claims, 7 Drawing Sheets

TAPE-LIKE CARRIER FOR MOUNTING OF INTEGRATED CIRCUIT

BACKGROUND OF THE INVENTION

The present invention relates to a tape-like carrier for mounting of integrated circuit, and more particular to the tape-like carrier used for tape automated bonding in which plural inner leads are automatically bonded to a semiconductor pellet. Further the present invention relates to the tape-like carrier suitable for connection of very multiple terminals of a semiconductor pellet with electronic elements.

Heretofore well known is a longitudinally extending tape-like carrier for mounting of integrated circuit including sets of leads secured to a flexible insulating film having longitudinally spaced apertures which are dimensioned to encompass contact regions of semiconductor pellet, said leads extending from the periphery of the every aperture toward the inside thereof (U.S. Pat. No. 3,689,991).

FIGS. 1 to 2b show one prior illustration of such a tape-like carrier for mounting of integrated circuit, together with a semiconductor pellet having bump electrodes with leads, FIG. 1 being a plan view, FIG. 2a being a cross-sectional view taken on line IIa-IIa of FIG. 1 and FIG. 2b being a cross-sectional view taken on line IIb-IIb of FIG. 1.

With reference to FIGS. 1 to 2b, the conventional tape-like carrier for mounting of integrated circuit comprises a flexible insulating film 5 in the form of tape made of polyimide. The flexible insulating film 5 is provided with sprocket holes 7 at regular intervals along the longitudinal direction in both side regions thereof. Further the flexible insulating film 5 has longitudinally spaced apertures 26 which are dimensioned to encompass contact regions of a semiconductor pellet.

Longitudinally spaced sets of leads 23 and bars 28 in the form of a frame leading to the leads 23 are formed on the flexible insulating film 5. The leads 23 extend within the periphery of a respective aperture 26 for semiconductor pellet. Between the leads 23 and the leads 23 and between the leads 23 and the bars 28, a surface of the flexible insulating film 5 is partially exposed.

Located in the center of the aperture 26 is a semiconductor pellet 1 having plural bump electrodes 2 formed on the contact regions of the pellet 1. The bump electrodes 2 are bonded to the corresponding leads 23 which are arranged at regular intervals so as to be coincident with the bump electrodes 2, by a heat bonding method using a bonding tool, that is, gang bonding.

When bonding of very multiple inner leads 23 with very multiple bumps 2 of the semiconductor pellet is performed using the above tape-like carrier for mounting of an integrated circuit, the heat dissipation characteristic is remarkably worse so that the following inconvenience occurs: i.e., as metal regions which dissipate heat of the leads 23 conducted from the bonding tool are only the surfaces of the bars 28 and the leads 23, the efficiency of heat dissipation is low.

Therefore, when the inner lead bonding is performed by using the above tape-like carrier for mounting the integrated circuit, thermal expansion of the leads 23 and the deformation and contraction of the flexible insulating film 5 occur, which results in the change of pitches between the leads 23. Thereby, an outer lead bonding for mounting the semiconductor pellet 1 to a substrate (not shown) or to an outer lead frame cannot be normally performed in a postprocess, which results in the faulty bonding.

SUMMARY OF THE INVENTION

It is an object of the present invention to provide a tape like carrier for mounting an integrated circuit which has a high efficiency of heat dissipation and by which the faulty outer bonding can be avoided.

The above object is accomplished by a tape-like carrier for mounting an integrated circuit, comprising a tape-shaped flexible insulating film formed at two opposite edge regions thereof with sprocket holes, the insulating film including a plurality of apertures each having a size dimensioned to encompass a contact region of a semiconductor pellet, the apertures being provided in a length-wise direction of the tape-shaped flexible insulating film; heat radiation metallic films attached to one of surfaces of the insulating film and provided over the area thereof to peripherally surround all upper edges of each of the apertures; conductive bars provided on the insulating film in spaced relationship from the sprocket holes so that adjacent metallic films are connected to each other by the conductive bars and are spaced from the sprocket holes; and leads extending from a respective edge of each of the metallic films inwardly of the aperture towards the contact region without overlapping the insulating film so as to be able to contact the contact region of the semiconductor pellet. The metallic films form metal regions around upper edges of each aperture to provide efficient heat dissipation of the leads.

In the present invention, the term "contact regions of the semiconductor pellet" is defined as regions of the semiconductor pellet in which plural bump electrodes are formed.

In the present invention, said leads are preferably formed integrally with said metallic radiation film, the edge of the metallic radiation film along the periphery of the aperture conforming to the periphery of the aperture or extending only within the periphery of the aperture.

In the present invention, as the flexible insulating film use can be made of polyester, polyimide or other dielectric plastic films; however use can be, preferably made of polyimide because of its thermal stability and resistance to demensional changes under stress.

In the present invention the metallic radiation films act to radiate heat of the leads.

As a material of the metallic radiation film, metal or alloy), for example copper, aluminum, tin, gold, silver or copper alloy can be applied. However, copper or copper alloy can be preferably used as a material of the metallic radium film, because the metallic radiation film can be formed integrally with the leads.

The metallic radiation films which are adjacent to each other are preferably electrically connected with each other through bars so that current can be conducted through the metallic radiation films and the bars to the leads, so that electroplating of metal such as gold on the leads is possible.

In the present invention, the metallic radiation film can have the thickness greater than that of the leads, by which heat of the leads can be more efficiently removed from the leads since heat of the leads can be immediately conducted to the thicker metallic radiation film.

In the present invention, since heat of the leads is immediately conducted to the metallic radiation films and the heat is radiated from the surfaces of the metallic radiation films, heat expansion of the leads and the deformation and contraction of the flexible insulating film can be avoided.

Accordingly, since the pitch between the leads can be always maintained at a given interval, an outer lead bonding can be always succeedingly performed.

DETAILED DESCRIPTION OF THE INVENTION

Then, the present invention will be explained with reference to the drawings.

Figure 3:
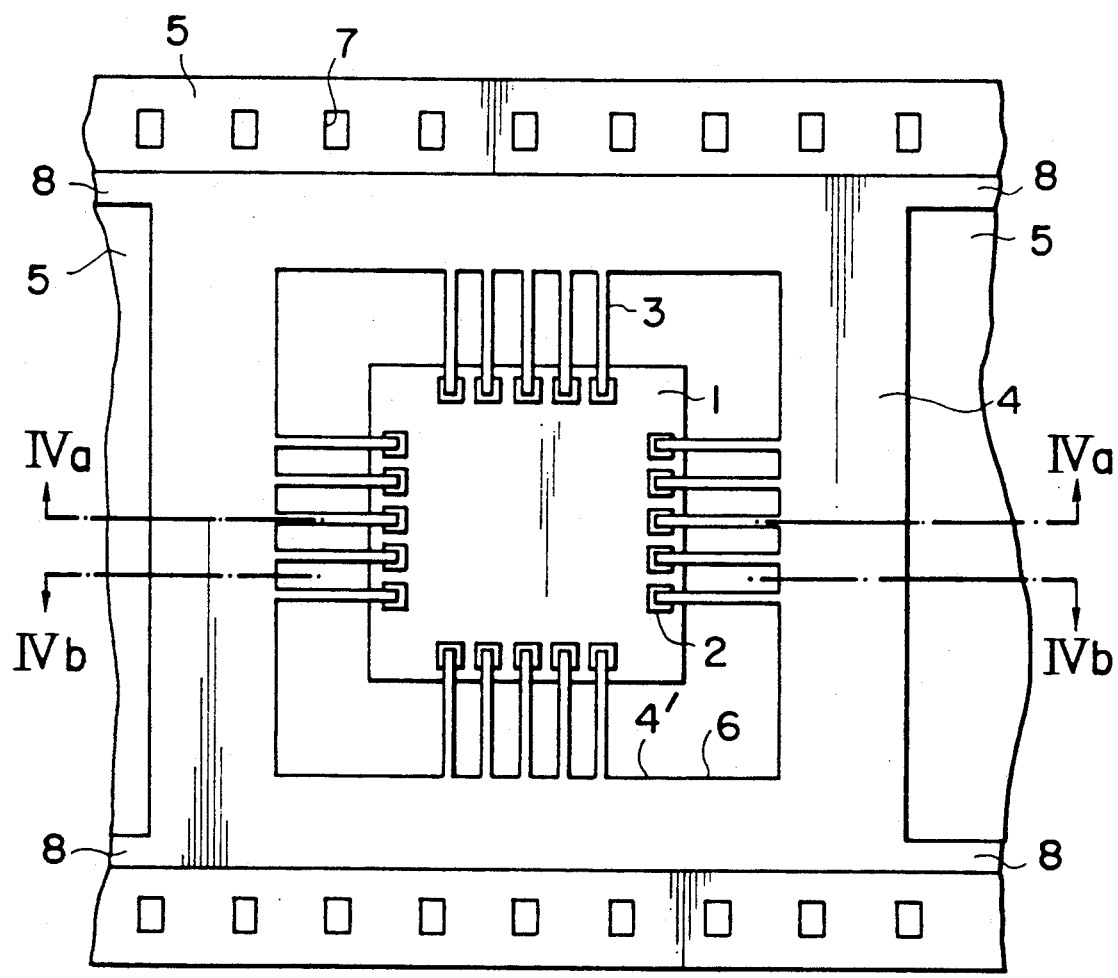
FIGS. 3, 4a and 4b show a first embodiment of the present invention, FIG. 3 being a plan view thereof, FIG. 4a being a cross-sectional view thereof taken on line IVa—IVa of FIG. 3, and FIG. 4b being a cross-sectional view thereof taken on line IVb—IVb of FIG. 3.
Figure 4A:
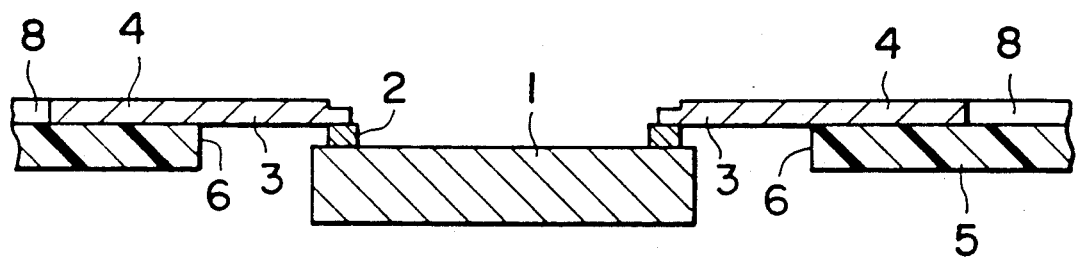
Figure 4B:
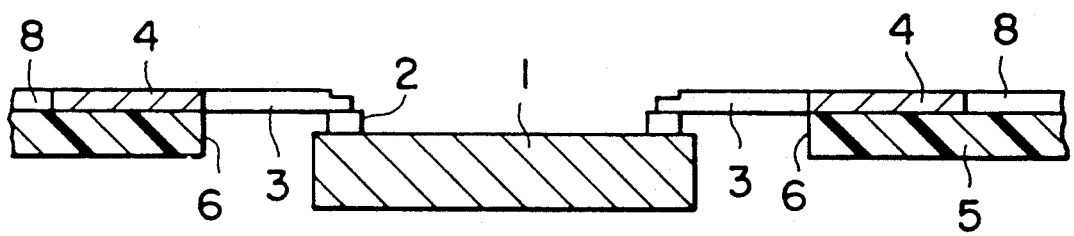

FIGS. 3 to 4b show a first embodiment of the present invention.

A tape-like carrier for mounting an integrated circuit according to the present invention comprises a flexible insulating film 5 in the form of tape, preferably made of polyimide. The flexible insulating layer 5 is provided with plural sprocket holes 7 spaced at regular intervals along the longitudinal direction in both side regions thereof in the same manner as the conventional one. Further the flexible insulating film 5 has longitudinally spaced apertures 6 which are dimensioned to encompass contact regions of the semiconductor pellet 1 in which plural bump electrodes 2 are formed.

Metallic radiation films 4 for radiating heat of the leads in the case of the inner lead bonding are laminated on the whole marginal zone of the flexible insulating film 5 along the whole periphery of the respective aperture 6, except for the both side regions of the flexible insulating film 5. The edge 4' of the metallic radiation film along the periphery of the respective aperture 6 conforms to the periphery of the respective aperture 6. The metallic radiation films 4 are made of metal or alloy, for example, copper or copper alloy. The metallic radiation films 4, which are adjacent to each other, are connected with each other through bars 8 positioned between the metallic radiation films 4 along the both side regions of the flexible insulating film 5 so that current can be conducted through the metallic radiation films 4 and the bars 8 to the leads 3, thereby electroplating of metal, such as gold, on the leads is possible. Further, leads 3 being integral with the respective metallic radiation film 4 project from the respective metallic radiation film 4 around the respective aperture 6 for the semiconductor pellet 1 toward the inside thereof.

The tape-like carrier for mounting an integrated circuit of this embodiment can be obtained by the following method. The apertures 6 for the semiconductor pellet and the sprocket holes 7 are made in the flexible insulating film 5, for example made of polyimide film strip. Then, foil of metal or alloy, for example copper foil or copper alloy foil is laminated with the flexible insulating film 5 through an adhesive layer. Thereafter a pattern of photoresist is formed on the foil of metal or alloy and the unwanted metal or alloy region is etched away in accordance with a known etching method to form the leads 3 and the metallic films 4 for radiating heat.

Using the tape-like carrier for mounting an integrated circuit manufactured in the above-mentioned method, the inner lead bonding of the leads 3 with bumps 2 provided on semiconductor pellet 1 can be performed with a bonding tool as in the conventional method.

Figure 5A:
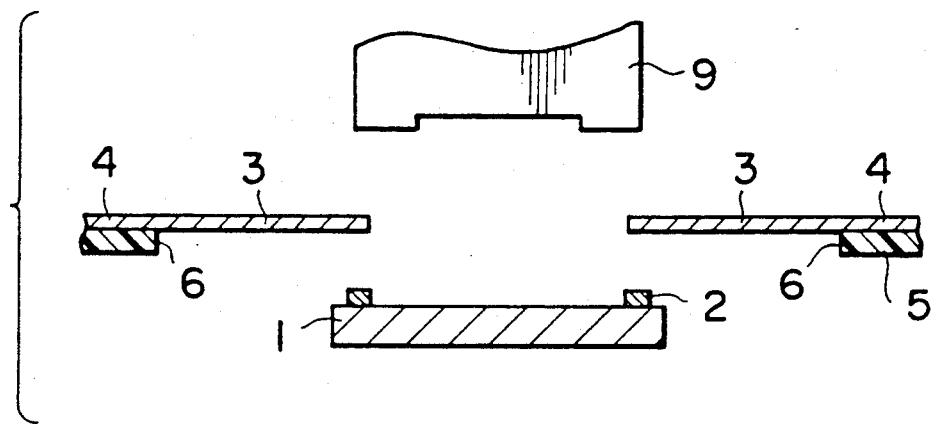
FIGS. 5 (a) to (c) are cross-sectional views showing processes of the inner lead bonding by using the tape-like carrier for mounting of an integrated circuit of the first embodiment, respectively.
Figure 5B:
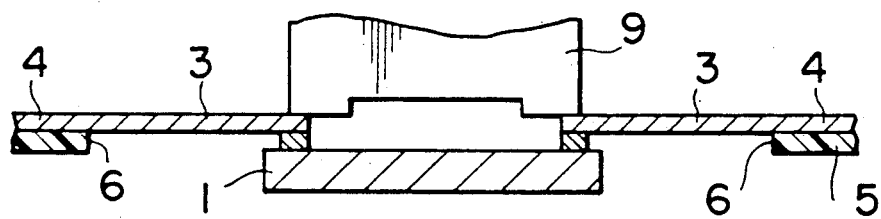
Figure 5C:
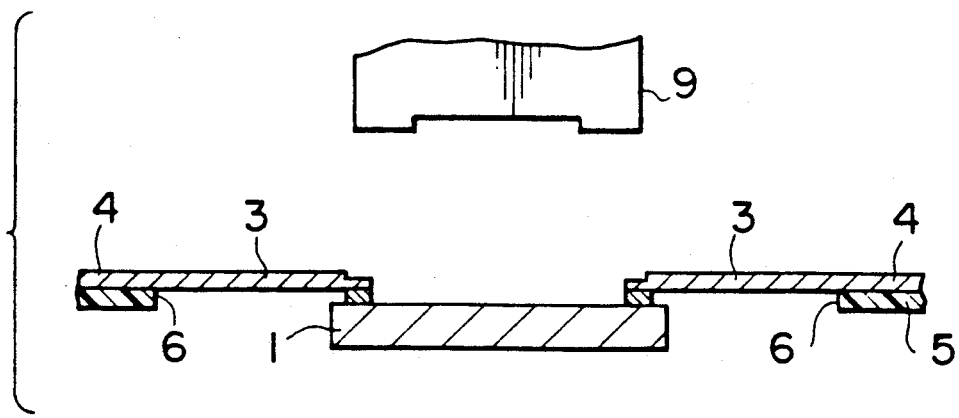

Then, with reference to FIGS. 5 (a) to (c), a method of the inner lead bonding using a tape-like carrier for mounting the integrated circuit according to this embodiment is explained.

First, as in FIG. 5 (a), semiconductor pellet 1 is located in such position that bump electrodes 2 are opposite to raised parts of a bonding tool 9, respectively, and the tape-like carrier for mounting the integrated circuit of this embodiment is arranged in the position that the leads 3 are opposite to the bump electrodes 2, respectively. As above-mentioned, the leads 3 are integral with the metallic radiation film 4 on the flexible insulating film 5 and project from the metallic radiation film 4 around the aperture 6 toward the inside thereof.

Then, as shown in FIG. 5 (b), plural leads registered with plural bump electrodes 2 and heat-sealed to the corresponding bump electrodes 2, respectively.

Then as in FIG. 5 (c), the bonding tool 9 is released from the semiconductor pellet 1, thereby ending the inner lead bonding.

Figure 1:
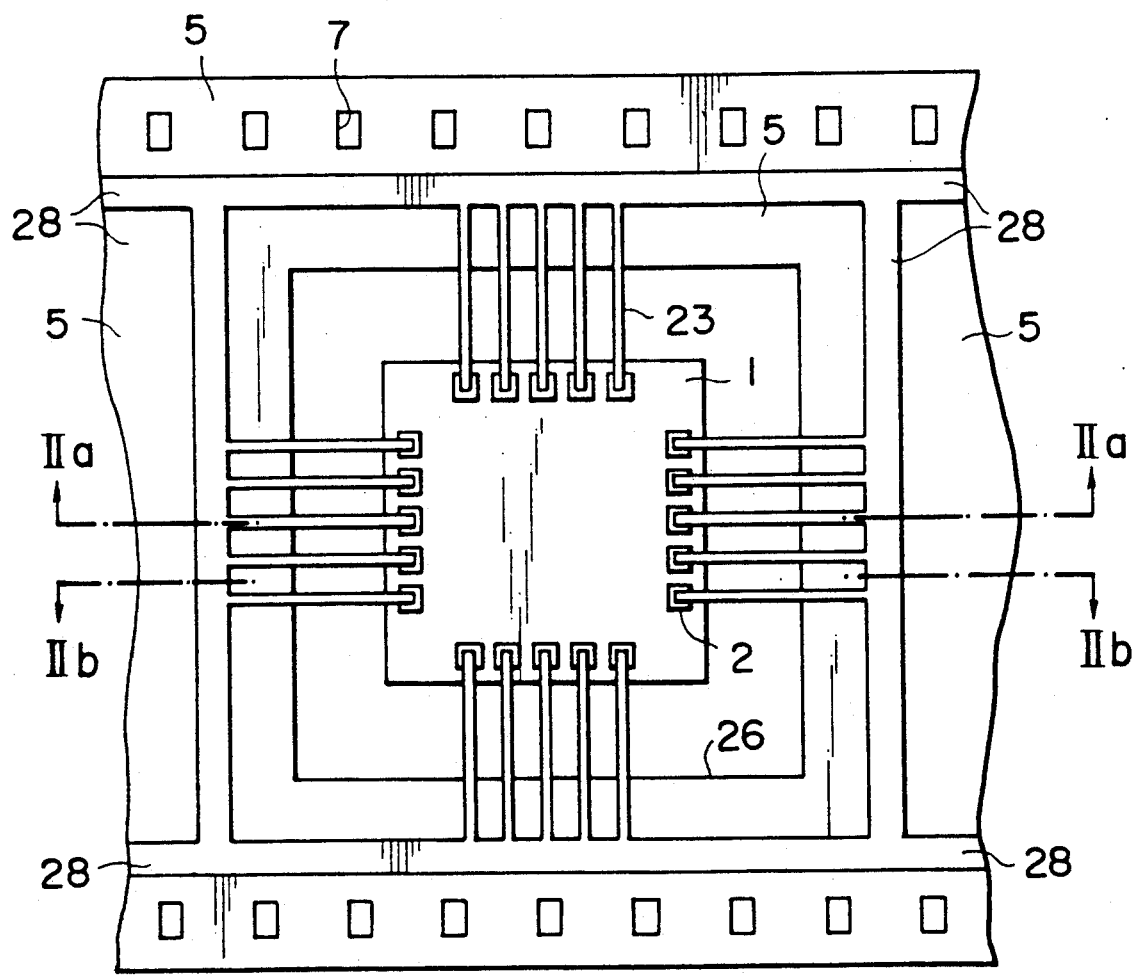
FIGS. 1, 2a and 2b show a conventional tape-like carrier for mounting of integrated circuit, together with a semiconductor pellet having bumps which are bonded with leads, FIG. 1 being a plan view thereof, FIG. 2a being a cross-sectional view thereof taken on line IIa—IIa of FIG. 1, and FIG. 2b being a cross-sectional view thereof taken on line IIb—IIb of FIG. 1.
Figure 2A:
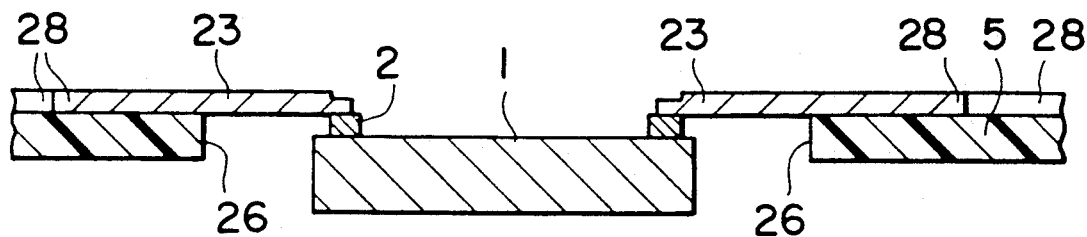
Figure 2B:
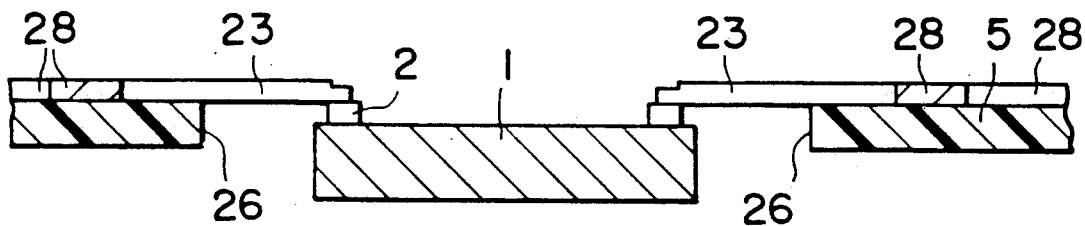

In the present invention, heat fed from the bonding tool 9 to the ends of the leads 3 during the inner lead bonding is conducted through the leads 3 to the metallic radiation films 4 provided on the flexible insulating layer 5 around the respective aperture 6 and radiated from the surfaces of the metallic radiation films 4. Therefore, a rise of the temperature of the leads 3 and the flexible insulating film 5 under the leads 3 in the bonding process is extremely lower as compared with a conventional tape-like carrier for mounting an integrated circuit as shown in FIG. 1, therefore heat expansion of the leads 3 and the deformation and contraction of the flexible insulating film can be avoided.

Accordingly, since the pitch between the leads can be always maintained at a given interval, the outer lead bonding can be always succeedingly performed.

Figure 6:
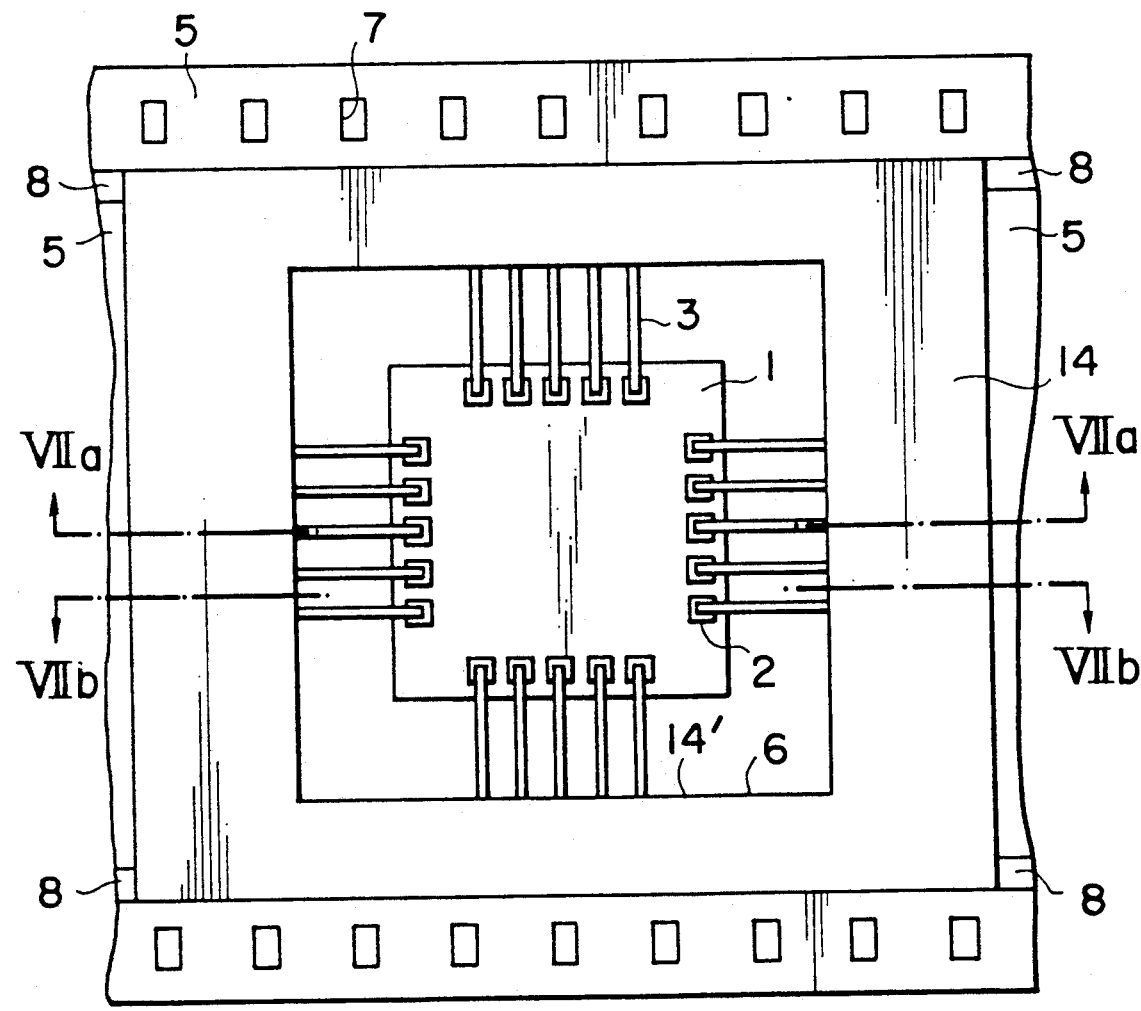
FIGS. 6, 7a and 7b show a second embodiment of the present invention, FIG. 6 being a plan view thereof and FIG. 7a being a cross-sectional view thereof taken on line VIIa—VIIa of FIG. 6, and FIG. 7b being a cross-sectional view thereof taken on line VIIb—VIIb of FIG. 6.
Figure 7A:
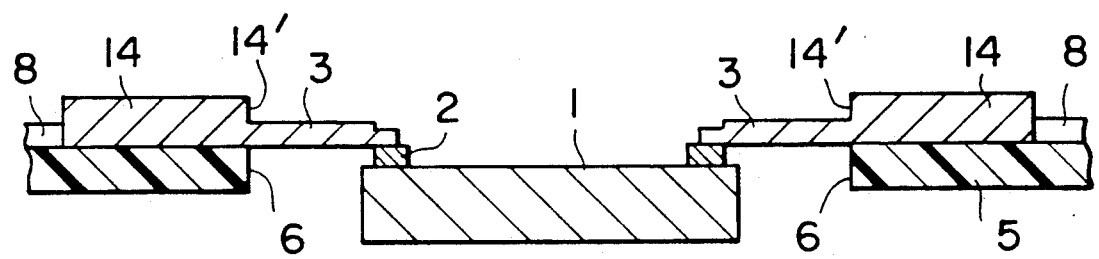
Figure 7B:
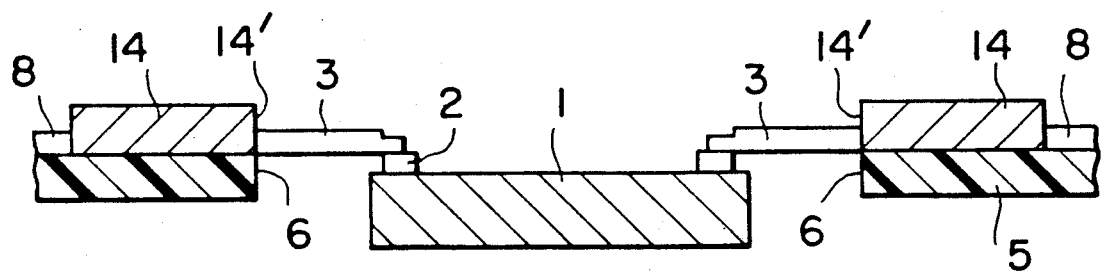

FIGS. 6 to 7b show a second embodiment of the present invention.

The second embodiment is the same as the first embodiment, except a metallic radiation film 14 has the thickness greater than that of the leads 3.

In FIGS. 6 to 7b, same reference numbers designate like parts as in FIGS. 3 to 4b, to which explanation is omitted.

According to the second embodiment, heat of the leads 3 can be more efficiently removed from the leads during the inner lead bonding because the leads are immediately conducted to the thicker metallic radiation film and heat is released from the surface thereof; therefore the pitch between the leads can be precisely maintained at the given interval so that the outer lead bonding can be succeedingly performed.

What is claimed is:

1. A tape-like carrier for mounting an integrated circuit, comprising:

a tape-shaped flexible insulating film formed at two opposite edge regions thereof with sprocket holes;

said film including a plurality of apertures each having a size dimensioned to encompass a contact region of a semiconductor pellet, said apertures being provided in a length-wise direction of said tape-shaped flexible insulating film;

heat radiation metallic films attached to one of surfaces of said insulating film and provided over the area thereof to peripherally surround all upper edges of each of said apertures;

conductive bars provided on said film in spaced relationship from said sprocket holes so that adjacent metallic films are connected to each other by said conductive bars and are spaced from said sprocket holes; and leads extending from a respective edge of each of said metallic films inwardly of the aperture towards said contact region without overlapping said insulating film so as to be able to contact said contact region of said semiconductor pellet, said metallic films forming metal regions around the upper edges of each aperture to provide efficient heat dissipation of said leads.

2. A tape-like carrier for mounting an integrated circuit as in claim 1, wherein the edges of said metallic films extend along a periphery of the respective aperture.

3. A tape-like carrier for mounting an integrated circuit as claimed in claim 1, wherein each of said leads is integral with one of said metallic films.

4. A tape-like carrier for mounting an integrated circuit as claimed in claim 1, wherein said metallic films have the thickness greater than that of said leads.

5. A tape-like carrier for mounting an integrated circuit as claimed in claim 4, wherein each of said leads is integral with a respective metallic film.

6. A tape-like carrier for mounting an integrated circuit as claimed in claim 1, wherein said metallic films each include a film made of metal or alloy.

7. A tape-like carrier for mounting an integrated circuit as claimed in claim 1, wherein said metallic films each include a film made of copper or copper alloy.

8. A tape-like carrier for mounting an integrated circuit as claimed in claim 1, wherein said flexible insulating film is a polyimide film.

9. A tape-like carrier for mounting an integrated circuit as claimed in claim 1, wherein contact regions of a plurality of semiconductor pellets provided on said film are regions of the pellets including plural bump electrodes.

* * * * *

UNITED STATES PATENT AND TRADEMARK OFFICE
CERTIFICATE OF CORRECTION

PATENT NO. : 5,095,361
DATED : March 10, 1992
INVENTOR(S) : YUJI IWATA

It is certified that error appears in the above-identified patent and that said Letters Patent is hereby corrected as shown below:

Title page, item

[30]  Foreign Application Priority Data

Dec. 27, 1988 [JP]   Japan.........63-333762

Signed and Sealed this

First Day of June, 1993

Attest:

MICHAEL K. KIRK

*Attesting Officer*    *Acting Commissioner of Patents and Trademarks*